US011112460B2

(12) United States Patent
Feltham et al.

(10) Patent No.: US 11,112,460 B2
(45) Date of Patent: Sep. 7, 2021

(54) LITHIUM BATTERY PASSIVATION DETECTION

(71) Applicant: JOHNSON CONTROLS FIRE PROTECTION LP, Boca Raton, FL (US)

(72) Inventors: Robert Reginald Albert Feltham, Fort Lauderdale, FL (US); Martin A. Chiarizio, Coral Springs, FL (US); Vyacheslav Voloshin, Coral Springs, FL (US)

(73) Assignee: JOHNSON CONTROLS FIRE PROTECTION LP, Boca Raton, FL (US)

( * ) Notice: Subject to any disclaimer, the term of this patent is extended or adjusted under 35 U.S.C. 154(b) by 0 days.

(21) Appl. No.: 16/600,209

(22) Filed: Oct. 11, 2019

(65) Prior Publication Data

US 2020/0284843 A1    Sep. 10, 2020

Related U.S. Application Data

(63) Continuation of application No. PCT/US2019/020961, filed on Mar. 6, 2019.

(51) Int. Cl.
*G01R 31/36* (2020.01)
*G01R 31/3835* (2019.01)
(Continued)

(52) U.S. Cl.
CPC ..... *G01R 31/3835* (2019.01); *G01R 31/3648* (2013.01); *H01M 10/4257* (2013.01); *H01M 10/48* (2013.01); *H01M 2010/4278* (2013.01)

(58) Field of Classification Search
CPC ........... G01R 31/3835; G01R 31/3648; G01R 31/396; G01R 31/382; H01M 10/4257;
(Continued)

(56) References Cited

U.S. PATENT DOCUMENTS 4,839,248 A    6/1989 Magnussen, Jr. et al.
6,045,941 A    4/2000 Milewits
(Continued)

FOREIGN PATENT DOCUMENTS

EP    0891000 A2    1/1999
WO    9808265 A1    2/1998
(Continued)

OTHER PUBLICATIONS

International Search Report and the Written Opinion of the International Searching Authority for corresponding International Application No. PCT/US2019/020961 dated Oct. 7, 2019.
(Continued)

*Primary Examiner* — Jeffrey P Aiello
(74) *Attorney, Agent, or Firm* — Arent Fox, LLP

(57) ABSTRACT

A method for determining lithium battery passivation starts by applying a load across a lithium battery at the start of a test interval. Measurements of the battery's voltage are taken after applying the load, and then again periodically during the test interval. A final measurement of the battery's voltage at the end of the test interval. The state of the battery is then determined based on the first and final measurements, and at least one of the periodic measurements.

11 Claims, 12 Drawing Sheets

(51) Int. Cl.
*H01M 10/42* (2006.01)
*H01M 10/48* (2006.01)

(58) Field of Classification Search
CPC ............. H01M 10/48; H01M 10/0525; H01M 10/052; H02J 50/80
USPC ........ 320/132, 136, 162; 324/426, 429, 433; 702/57, 63–65, 79, 81, 117, 182
See application file for complete search history.

(56) References Cited

U.S. PATENT DOCUMENTS

| | | | |
|---|---|---|---|
| 6,268,712 B1 * | 7/2001 | Laig-Horstebrock | G01R 31/3842 320/132 |
| 7,009,363 B2 * | 3/2006 | Beals | H02J 7/34 320/117 |
| 10,268,229 B2 * | 4/2019 | Stever | H02J 7/0063 |
| 2001/0043144 A1 * | 11/2001 | Morris | G08B 21/12 340/692 |
| 2003/0184307 A1 * | 10/2003 | Kozlowski | H01M 6/5044 324/427 |
| 2004/0173267 A1 * | 9/2004 | Jacksier | G05D 16/0402 137/613 |
| 2008/0101078 A1 | 5/2008 | Stokes | |
| 2012/0071040 A1 * | 3/2012 | Park | H01R 4/489 439/889 |
| 2012/0265264 A1 | 10/2012 | Vaisnys et al. | |
| 2012/0268074 A1 * | 10/2012 | Cooley | H02J 7/007 320/130 |
| 2012/0280830 A1 | 11/2012 | Heath | |
| 2013/0024306 A1 * | 1/2013 | Shah | G06Q 20/32 705/17 |
| 2013/0335030 A1 * | 12/2013 | Joe | H01M 10/052 320/134 |
| 2014/0338181 A1 | 11/2014 | Allgaier et al. | |
| 2015/0171655 A1 | 6/2015 | Venkataramani et al. | |
| 2015/0270725 A1 * | 9/2015 | Sorin | H01M 10/48 320/136 |
| 2016/0041231 A1 * | 2/2016 | Lee | G01R 31/382 702/63 |
| 2016/0231386 A1 * | 8/2016 | Sung | G01R 31/367 |
| 2017/0025686 A1 * | 1/2017 | Klewer | H01M 6/14 |
| 2018/0029228 A1 * | 2/2018 | Haddadin | B25J 9/1628 |
| 2018/0323478 A1 * | 11/2018 | Paulsen | H01M 10/4257 |
| 2019/0277916 A1 * | 9/2019 | Sun | H01M 10/613 |
| 2019/0323305 A1 | 10/2019 | Fripp et al. | |

FOREIGN PATENT DOCUMENTS

| | | |
|---|---|---|
| WO | 2014114331 A1 | 7/2014 |
| WO | 2018030998 A1 | 2/2018 |

OTHER PUBLICATIONS

International Search Report & Written Opinion issued in PCT Application No. PCT/US2019/020961, dated Oct. 7, 2019, 28 Pages.

International Search Report and the Written Opinion of the International Searching Authority issued in corresponding International Application No. PCT/US2019/020970 dated Dec. 17, 2019.

* cited by examiner

Fig. 1: Brand-New Lithium Battery

Fig. 2: Second Load Check on Battery

Fig. 3: Battery After Activation /Depassivation

Fig. 4: Depleted Batteries

Fig. 5: Partially Deplete and Partially Passivated Batteries

LITHIUM BATTERY PASSIVATION DETECTION

The present application is a continuation of International Application No. PCT/US2019/020961, filed Mar. 6, 2019, entitled "LITHIUM BATTERY PASSIVATION DETECTION," the entire contents of which are incorporated herein by reference.

BACKGROUND OF THE INVENTION

Fire detection systems comprise many components, such as fire panels, smoke and other environmental detectors, visual and/or audible notification appliances (annunciators) and other equipment spread throughout a building or campus, etc. Because fire detection systems are important to the safety of both person and property, it is necessary that they continue to operate for as long as possible even with the loss of primary power. Traditionally, fire panels have contained backup batteries that take over when main power fails, and which also provide power to the detectors and notification appliances. In a wired system, this makes sense, because the panel can communicate with the various devices over wires while providing power to them over the same wires.

In recent times, however, more systems are turning to wireless communications in which case there is no wired connection between a panel and other devices. In these systems, main power is typically supplied to the devices via normal building wiring within the walls. However, these devices also contain backup batteries that take over when main power fails. Lithium ion batteries ("lithium batteries") are often used for this purpose because, for example, they have a much greater energy density than other batteries and a very slow rate of discharge.

However, given a lengthy period of non-use, for example when a device has been in storage prior to installation, or when there has been no loss of main power for months and thus no draw from the backup battery, a film, e.g., lithium chloride, forms on the battery's surface. This is known as "passivation". Passivation protects the battery while in storage, however it also presents a high resistance, inhibiting the battery from providing power to its full capability.

Passivation starts immediately after a battery is manufactured. It is the forming of an internal crystalline structure inside the battery chemistry to protect the battery from self-depleting. Passivation occurs more rapidly at higher temperatures, typically above 85° F. This crystalline structure reduces the apparent capacity of the battery, giving the appearance of a false-low battery unless the passivation is eliminated. Passivation may be eliminated inside the battery by the application of a sufficiently high current to breakdown/remove the crystalline structure. There are several methods for passivation, including drawing a low current for a long period of time, or drawing a larger current for a shorter period of time.

SUMMARY OF THE INVENTION

A method for determining lithium battery passivation starts by applying a load across a lithium battery at the start of a test interval. Measurements of the battery's voltage are taken after applying the load, and then again periodically during the test interval. A final measurement of the battery's voltage at the end of the test interval. The state of the battery is then determined based on the first and final measurements, and at least one of the periodic measurements. The status may be, for example, depassivated, partially passivated, fully passivated, partially depleted, or a combination of passivation and depletion.

The sequence of periodic measurements may be compared and matched against a set of profiles, and the battery state is then determined by identifying which of the profiles the sequence most closely matches, each profile corresponding to a state.

A first device may be in wireless communication with a second device. The first device may include an electronic circuit powered by a lithium battery (or plural lithium batteries). A battery test circuit determines the state of the battery, and a depassivation circuit applies a depassivation algorithm to the battery depending on the determined state. A microcontroller may operate the battery test circuit and the depassivation circuit.

The first device may be, for example, a notification appliance that wirelessly communicates with a fire panel, and is configured to receive power from a main power source. The notification appliance may include at least one notification annunciator such as an audio speaker, siren or strobe, and may be configured such that the lithium battery supplies power to it when the main power fails.

DETAILED DESCRIPTION

I. Lithium Battery Passivation Detection

Figure 1:
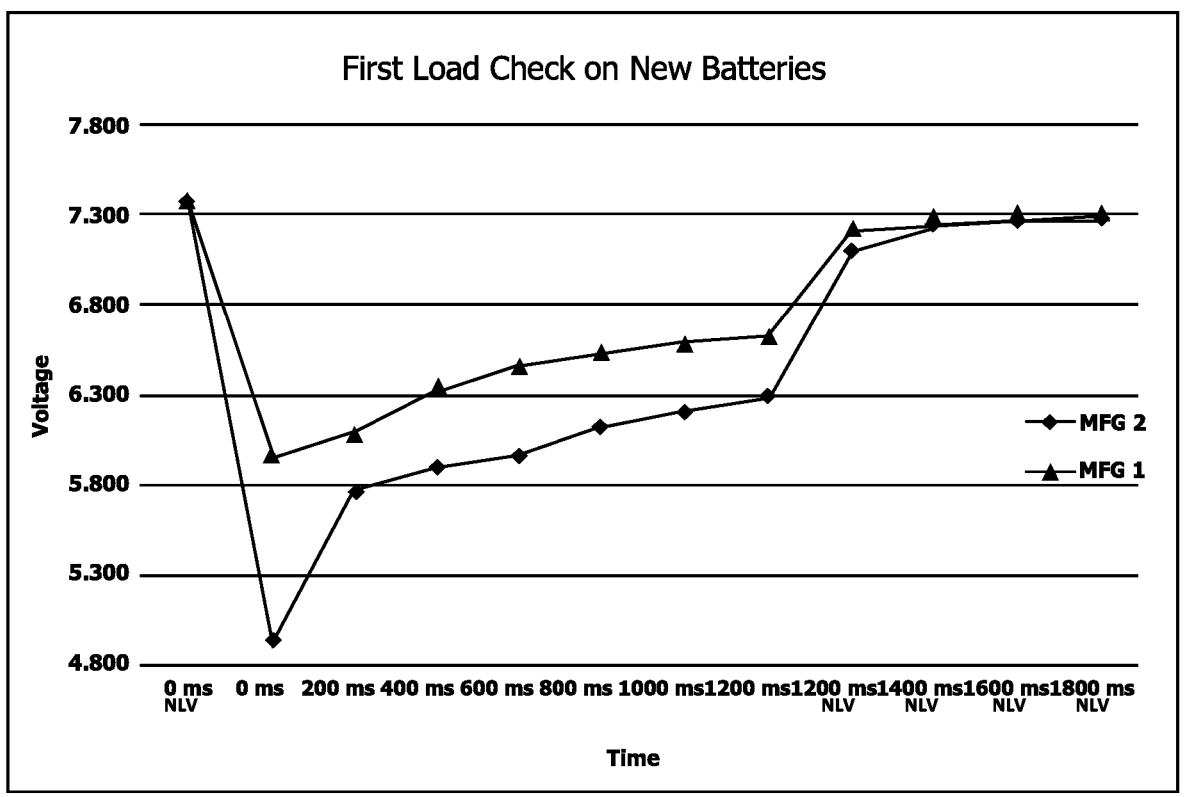
FIG. 1 is a graph illustrating the voltage response of a first load check on a new lithium battery during an evaluation.

How does one determine if a battery is depleted versus merely passivated? We have discovered that by measuring the battery's response to a timed current load, the battery status, i.e., whether it is passivated, depassivated, or depleted, can be determined. We have determined the characteristics of battery response to these conditions so that a battery will not automatically have a battery de-passivation applied to it if it is not needed.

On power-up, after the product has stabilized and been given sufficient time to enroll in or rejoin a network, the battery may be evaluated. If a de-passivation procedure needs to be performed, it will be applied to the battery.

When passivated lithium batteries are used in a circuit/device, such as a sounder (an audible notification appliance), the voltage severely dips during operation. A passivated battery is unable to supply the current required to drive the speaker and gives the appearance of a low-battery condition even though the battery may have rarely or never been used.

Prior to shipping lithium batteries to customers, some suppliers may depassivate the batteries. Lithium batteries fully passivate typically within 90 days of manufacture, or when not being used. Furthermore, once received by a customer, the batteries may not be used within 90 days, or may be placed in products and shelved in deployment warehouses for periods lasting longer than 90 days while waiting to be shipped to end users.

To prevent passivation once a battery has been installed in an active circuit, measurements may be taken to ensure there is sufficient current draw at a proper periodic rate to prevent passivation while ensuring that the device containing the battery delivers the required active alarm time and meets UL or other certification requirements.

One known technique for determining whether a battery is passivated is to measure the voltage under load and compare that to an expected voltage, but this technique cannot detect whether the batteries are at full capacity or partially or almost fully depleted.

The present invention detects whether a battery is passivated, partially passivated, not passivated (active), or depleted by periodically measuring the voltage response during the time that a resistive load is applied to. By measuring the voltage at the beginning of the application of a sufficient resistive load on the battery and then analyzing the battery voltage periodically while the load is applied and finally just before the load is released, the state of the battery can be determined.

A passivated battery will have the most significant voltage drop at the beginning of the application of the resistive load and then while the load is applied will start to rise. By measuring the change in voltage from the beginning to the end of the applied resistive load, the amount of passivation may be determined. If the voltage change is minimal, the battery is not passivated. On the other hand, if the voltage drops during the period, then the battery has started to be depleted and based on the change in voltage the amount of depletion can be estimated.

Using the above voltage load check, the status of a battery can be verified at any time during normal operations. This is useful for circuits where auxiliary lithium batteries may not be used for long periods of time, e.g., for standby or backup power. On the other hand, primary batteries under regular use do not passivate if the minimum battery usage (current draw) is sufficient to prevent passivation.

To test a battery, the battery's voltage is measured and recorded prior to applying the load to get the no-load voltage (NLV) and recorded. Next, a resistive load is applied to the battery through, for example, a MOSFET switch for a specific amount of time, e.g., 1,200 milliseconds (ms), and the voltage is monitored during this interval. That is, during the application of the resistive load (the 1,200 ms test period), the battery voltage is measured and recorded at periodic intervals, e.g., every 200 ms, starting just after the resistive load is applied (0 ms is defined as the time the load is first applied) until just before the resistive load is disconnected at the end of the 1200 ms test period. The timing of the intervals and the number of intervals could vary based upon requirements, but as an example a measurement may be taken every 200 ms, resulting in seven measurements over the 1200 ms test period. By comparing the positive and negative voltage changes from one measurement to the next or over other spans, the state of the battery may be determined.

In an embodiment, there are three basic states for determining battery status: a Power-up/Initialization State; a Wait State; and a Battery Status Evaluation State. It should be understood that the term "Target Battery" as used herein may comprise one or multiple batteries connected in series and/or parallel. The discussion below assumes the Target Battery consists of two batteries in series. While the voltages values cited could change accordingly, the ratios of voltage changes (shown as percentages) will change very little.

Power-Up/Init State

This state occurs when power is first applied. Resources are configured including a Target Battery IRQ (interrupt request) to detect the presence/removal of the Target Battery that needs to be evaluated. Before evaluating, the process waits a predetermined time, e.g., 60 seconds, to allow normal operations to complete. The Target Battery voltage is measured with no load to see if it is already connected. If the Target Battery is present, the Target IRQ is configured to detect the removal of the Target Battery. If the battery is removed, processes are halted and the device goes into a wait state, waiting for the target battery to be re-inserted. Once the battery is reinserted, the device exits the wait state and resumes activity based upon previous device status as determined as follows.

Whenever the target battery is connected or disconnected, an IRQ is triggered.

Depending upon the processor machine state, different responses are required. If the target battery is inserted prior to the timer expiring, the state is changed to EVAL_STATE and the device goes to sleep until the timer expires. If the Target Battery is removed prior to evaluation, TARGET_BATTERY_IRQ is configured to detect insertion of the Target Battery and the device goes to sleep until the Target Battery is connected. If the target battery is disconnected, the device goes to sleep until the target battery is connected, triggering a TARGET_BATTERY_IRQ.

On the other hand, if the Target Battery is disconnected during depassivation, the evaluation data is no longer valid. Once a new Target Battery is installed, the battery will be evaluation and depassivated based upon the new evaluation data.

Finally, if the Target Battery is not connected on power-up, the TARGET_BATTERY_IRQ is configured to detect the connection of the Target Battery and the device goes to sleep. When the Target Battery is connected TARGET_BATTERY_IRQ is triggered, the device wakes up and configures the TARGET_BATTERY_IRQ to detect the removal of the Target Battery. The State is set to the Wait State. The device goes to sleep for 60 seconds to allow normal operations to conclude before proceeding.

If the Target Battery is connected on power-up, besides configuring the TARGET_BATTERY_IRQ, three readings are performed at 30-minute intervals, after which (assuming the Target Battery is fully depassivated) the devices switches to a Maintenance Mode whereby evaluations, as described below, may be performed on a regular schedule, for example, every 2 hours or every 4 hours, or possibly upon the occurrence of certain events.

Wait State

In this state, the Target Battery has been inserted/connected to the device and the process is asleep waiting for either the 60-second timer to expire or for the Target Battery IRQ to trigger if the Target Battery is removed from the device. This 60-second period allows the device to finish normal operation before evaluation of the battery. If the 60-second timer expires and the Target Battery is still inserted, the state changes to the Battery Status Evaluation State.

If the Target Battery IRQ is triggered, indicating that the Target Battery has been removed or disconnected, it is verified that the Target Battery has been actually been removed, the timer is cleared, and then the Target IRQ is reset to detect the insertion of the batteries and the process goes back to sleep until the Target Battery is re-inserted and the 60 second timer is restarted, at which point the device returns to the Power Up/Init State.

Battery Status Evaluation State

In some embodiments, to determine which state a battery is in, battery voltage values are averaged over 5 readings at 2 ms intervals at each of the evaluation points, that is, at 0, 200, 400, 600, 800, 1,000 and 1,200 milliseconds (ms) of the test period.

In the case of the 0 ms evaluation point, the load is applied at 0 ms and then the first reading starts at the 30 ms point and four additional readings are taken at 2 ms intervals, i.e., readings are taken at 30, 32, 34, 36 and 38 ms. The five readings are then averaged. The readings start at 30 ms to allow the voltage to stabilize after the application of the resistive load. In the cases for 200 to 1,000 ms evaluation points, the readings start at 200, 400 ms, etc., and in each case five readings are made at 2 ms intervals and averaged. In the case of the (final) 1,200 ms interval, the reading are taken from 1,190 to 1,198 ms and then the load is released at 1,200 ms. The five readings for each evaluation point are averaged and stored so that the voltage response curve for all seven evaluation points can be used to determine the battery status.

It should be understood that different parameter values may be used. For instance, there could be more or less evaluation points, separated by intervals smaller or greater than 200 ms, and each "reading" at an evaluation point could be an average of other than five readings taken at other than 2 ms intervals. The test period itself could be other than 1200 ms, although we have found that 1200 ms appears to be optimal.

In an exemplary implementation, two lithium batteries may be connected in series for a nominal voltage of 7.2 Volts Direct Current (VDC) in order to provide sufficient power to a speaker in an audible alarm. But any combination of batteries in series and/or parallel could be used with the values adjusted accordingly. The following sections and figures detail the battery voltage response based on current battery conditions and how to differentiate these assorted battery conditions.

In the following discussion, as it relates to FIGS. 7-9, possible battery states are as follows:

BAT_PP (Possible Passivation)
BAT_PD (Possible Depletion)
BAT_PA (Possible Activated Battery)
BAT_PPD (Possible Passivation and Depleted Battery)

Battery Evaluation State: Step 1

Figure 7:
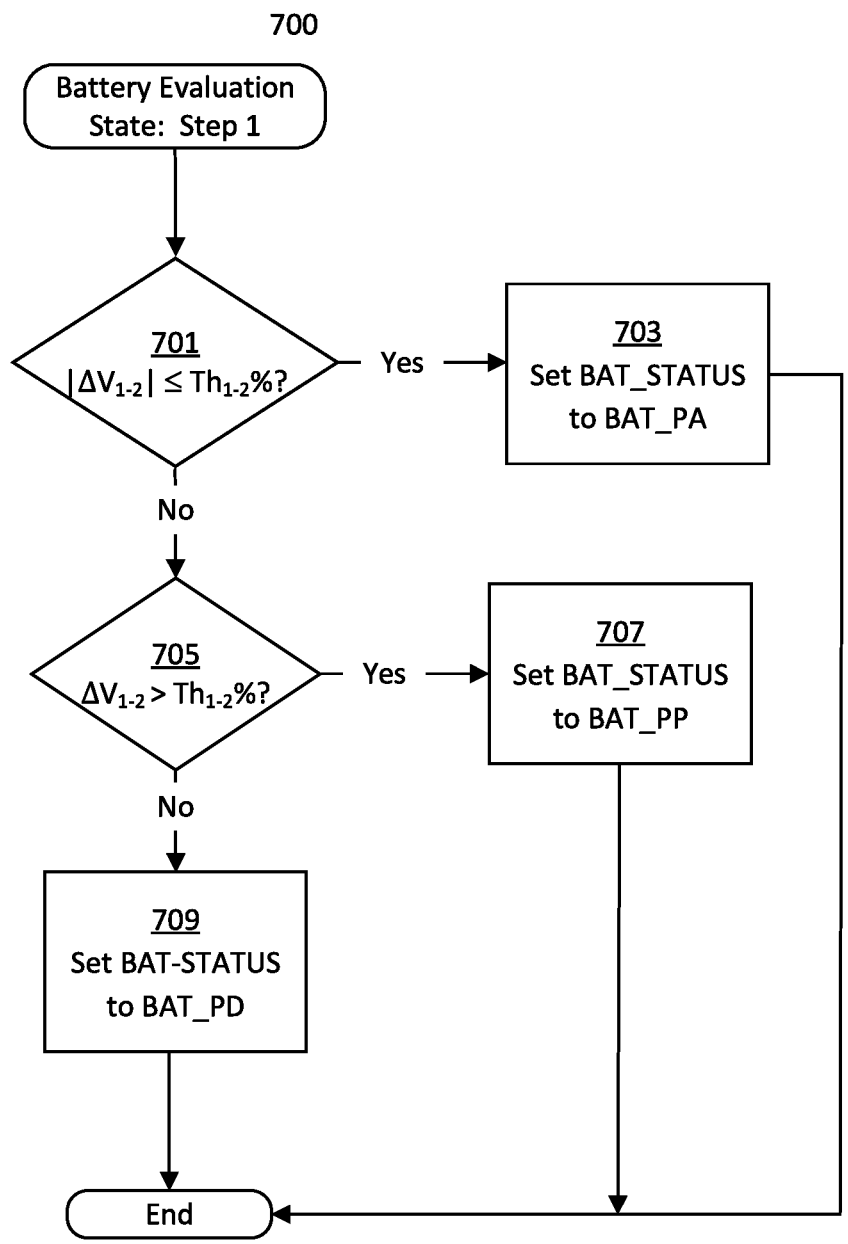
FIG. 7 is a flowchart illustrating the first step of a battery evaluation according to an embodiment of the present invention.

FIG. 7 is a flowchart describing the first step 700 of a battery evaluation according to an embodiment of the present invention.

First, the absolute value of the difference between the voltage measured between the first and second measurements $|\Delta V_{1-2}|$ is compared with a predetermined threshold $Th_{1-2}$ (step 701). Any or all such predetermined thresholds may be based on percentage of voltage change. If the voltage difference $|\Delta V_{1-2}|$ is less than (or equal to in this exemplary case) the threshold $Th_{1-2}$, then the change is small enough to consider insubstantial, and the battery status is set to BAT_PA (step 703).

On the other hand, some passivation is indicated if the change $\Delta V_{1-2}$ is positive and greater than the threshold $Th_{1-2}$, as determined at step 705, so the battery status is set to BAT_PP (step 707). Otherwise the change $\Delta V_{1-2}$ is negative and lower than $-Th_{1-2}$, indicating possible full or partial depletion, and the battery status is set to BAT_PD (step 709).

Battery Evaluation State: Step 2

Figure 8:
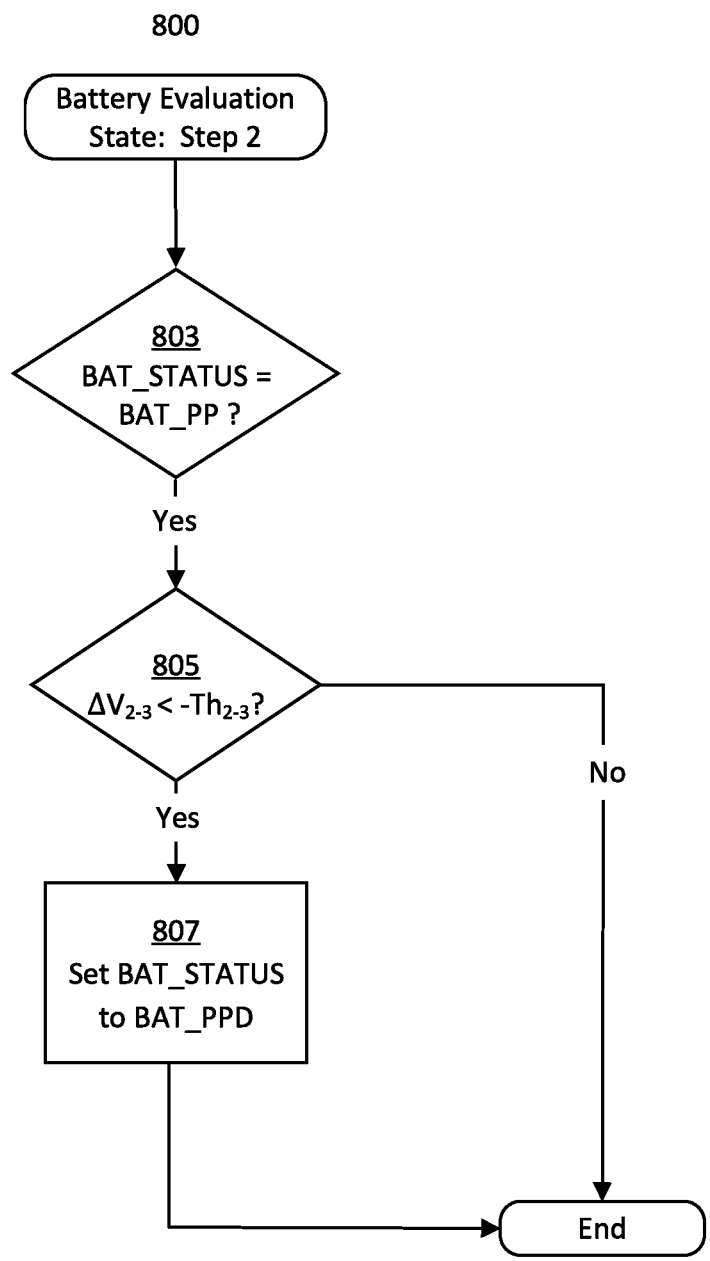
FIG. 8 is a flowchart illustrating the second step of a battery evaluation according to an embodiment of the present invention.

FIG. 8 is a flowchart illustrating the second step 800 of a battery evaluation according to an embodiment of the present invention.

Here, at step 803, if the battery state has previously been set to BAT_PP, then the change in voltage between the second and third measurements, or $\Delta V_{2-3}$, is compared to threshold $Th_{2-3}$ (step 805). Note that the thresholds $Th_{1-2}$ and $Th_{2-3}$ may have the same value, or may have different values. If $\Delta V_{2-3}$ is less than the negative $Th_{2-3}$, i.e., $\Delta V_{2-3} < -Th_{2-3}$, then the battery state is set to PPD (step 807); that is, there is possible depletion as well as passivation.

Battery Evaluation State: Step 3 Through Step 6

These steps are similar to step 2, but compare changes in voltage $\Delta V_{3-4}$, $\Delta V_{4-5}$, $\Delta V_{5-6}$, $\Delta V_{6-7}$, respectively between 400 ms and 600 ms (Step 3), between 600 ms and 800 ms (Step 4), between 800 ms and 1000 ms (Step 5), and finally between 1000 ms and 1200 ms (Step 6) against respective predetermined thresholds $Th_{3-4}$, $Th_{4-5}$, $Th_{5-6}$, $Th_{6-7}$.

In some embodiments, intervals other than every 200 ms and/or overlapping intervals, e.g., 200 to 600 ms and 400 to 800 ms, could also be used, or for example, the change in voltage over an interval may not be used at all, such as the change over the interval from 200 ms VDC to 800 ms VDC.

Evaluation Step 7 (Final Evaluation Step)

Figure 9:
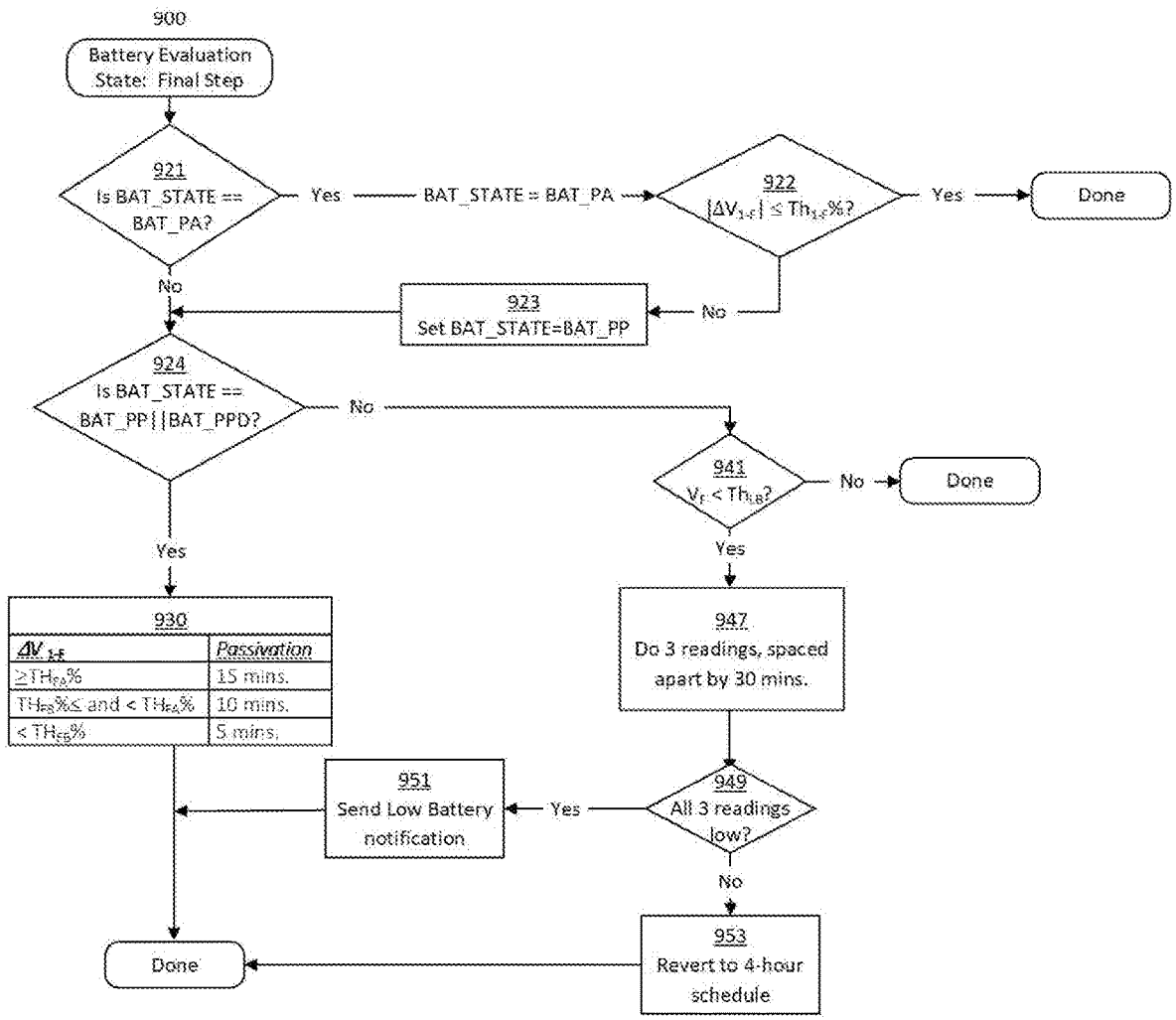
FIG. 9 is a flowchart illustrating the final step of a battery evaluation according to an embodiment of the present invention.

FIG. 9 is a flowchart 900 illustrating the final step of a battery evaluation according to an embodiment of the present invention.

If the battery state is BAT_PA (indicating possible activation) as determined in step 921, then $\Delta V_{1-F}$ is compared with threshold $Th_{1-F}$ (step 922). $Th_{1-F}$ may have the same value as any of the previously mentioned thresholds, or may have a different value. If the change in $\Delta V_{1-F}$ is less than $Th_{1-F}$, that is $|\Delta V_{1-F}| < Th_{1-F}$, then no action needs to be taken as any change is minimal. However, if $|\Delta V_{1-F}| > Th_{1-F}$, then the battery state is set to BAT_PP, indicating possible passivation.

If the battery state is BAT_PP or BAT_PPD (either state indicating possible passivation) as determined in step 924, then the degree of depassivation needed is determined. The change in voltage between the final measurement and the first (initial) measurement $\Delta V_{1-F}$ is compared in step 930 with two thresholds $Th_{FA}$ and $Th_{FB}$, where $Th_{FA} > Th_{FB}$. If $\Delta V_{1-F}$ is greater or equal to $Th_{FA}$, then there has been a high degree of passivation. If $\Delta V_{1-F}$ is between $Th_{FA}$ and $Th_{FB}$, then there has been a medium degree of depassivation; and if $\Delta V_{1-F}$ is less than $Th_{FB}$, then there has been a low degree of depassivation. The table in step 930 shows exemplary depassivation times for an embodiment.

If, on the other hand, at step 924 the battery state is neither BAT_PP nor BAT_PPD, then the final voltage $V_F$ is compared with a Low Battery threshold $Th_{LB}$. If $V_F$ $Th_{LB}$, then the battery is not depleted and nothing further need be done. Alternatively, $V_F<Th_{LB}$ may indicate a depleted battery, but rather than declaring the battery depleted at the first instance, a number of additional readings are taken at regular intervals, e.g., three additional readings spaced apart by 30 minutes (step 947). If all three readings are low ($V_F<Th_{LB}$) as determined at step 949, then a decision is made that the battery is depleted and a Low Battery notification is transmitted to personnel and/or other equipment as appropriate at step 951. If not all three readings are low, then at step 953, then the device reverts to the Maintenance Mode schedule, as described above.

Brand-New Battery

Theoretically, brand new lithium batteries are not passivated, but since it takes time to ship a battery and then put it into a product, and since passivation starts immediately, brand-new batteries typically have some passivation before they are used. Typically, lithium batteries are fully passivated within 90 days.

The voltage of a new battery that is slightly or fully passivated will drop immediately upon the application of a load, and then continue to rise during the application of the resistive load. The 0 ms no-load voltage (NLV) point shows the battery voltage just before the load is applied. When the load is applied the voltage drops in the MFG 1 example to about 5.97 VDC and at every measurement interval it continues to rise to 6.612 VDC until at the 1200 ms NLV point the load is disconnected. The voltage rises to 7.202V and then continues to rise as the battery recovers. When the load is removed, the battery will recover to or near its nominal voltage depending upon its depletion and passivation status.

FIG. 1 shows a positive voltage rise differential from 0 ms to 1200 ms of (6.612-5.970)=0.642 VDC, or a 10.8% rise, for manufacturer MFG1's battery, whereas manufacturer MFG 2's battery has a voltage differential of (6.286-4.94) =1.346 VDC. or 27.2%. Both are unused passivated batteries. For example, a 10% rise may indicate about 30% passivation, whereas a 27% rise may indicate close to 100% passivation. This example also shows an approximate voltage rise of about 150 to 200 mv per interval after the initial recovery following the drop in voltage. These values could vary from battery to battery; what is important is that the battery voltage continues to rise during each interval while the load is applied, by at least 25 mv per interval to indicate an unused passivated battery. Of course, in a single battery example, these values would be halved. As is demonstrated, actual voltages may vary from manufacturer to manufacturer, but the profile curve is similar.

Used Batteries

Used batteries have several possible states, partially or fully depleted and could have a passivation state from no passivation to 100% fully passivated. Once a battery has had even a single load test applied to it, the battery's status has changed.

Figure 2:
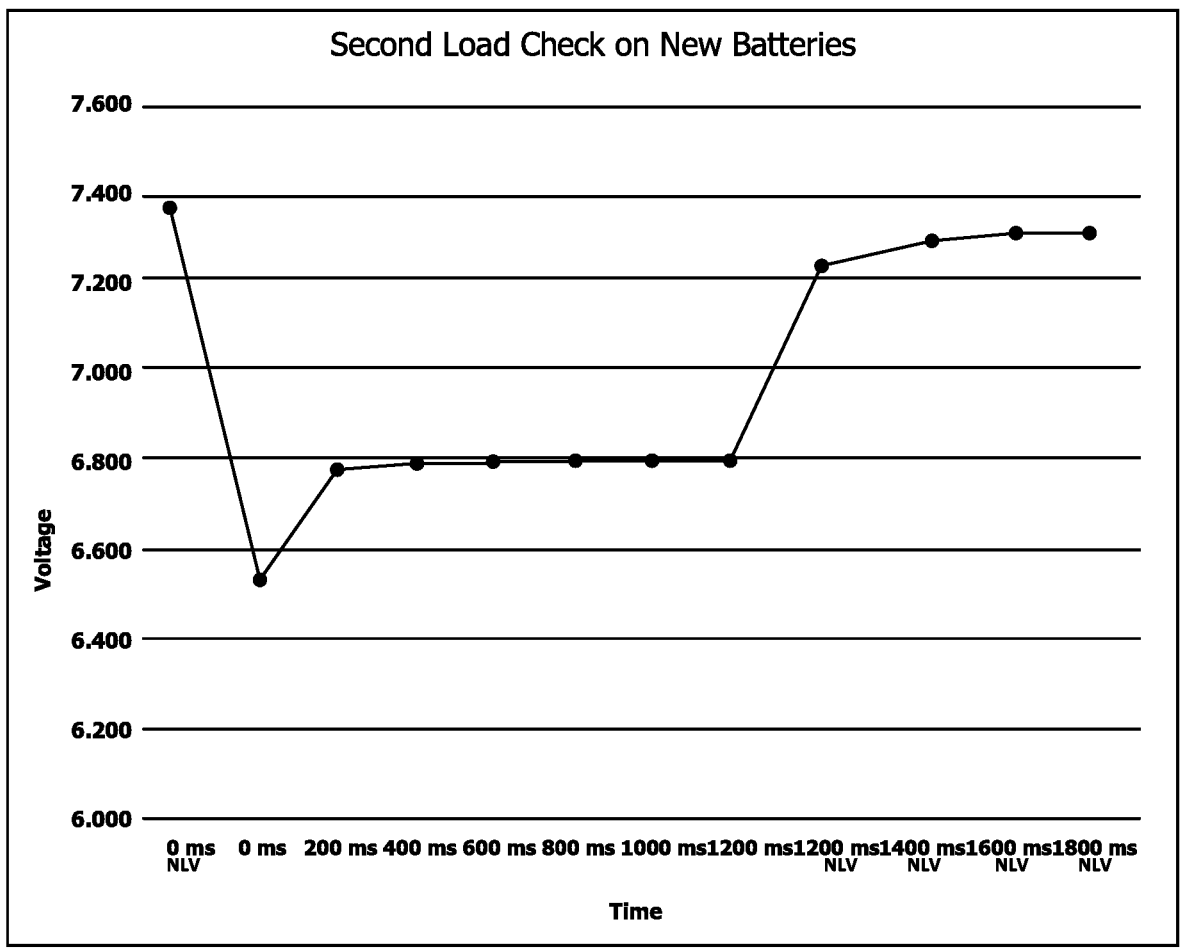
FIG. 2 is a graph illustrating the voltage response of a second load check on a new lithium battery during an evaluation.

As illustrated in FIG. 2, after even a single load check as described above with reference to FIG. 1, in the measurement intervals from 200 ms to 1200 ms the battery voltage is relatively flat. FIG. 1 shows the voltage rising throughout the evaluation time, while FIG. 2 shows a sharp rise from 0 ms to 200 ms, followed by a relatively flat response for the rest of the evaluation period. In this example, the positive voltage rise differential from 0 ms to 200 ms is (6.678-6.506) 0.172 VDC, whereas from 200 ms to 1200 ms there is only a 0.014 VDC (0.2%) rise. This indicates a battery that is passivated but not unused, and requires depassivation. Depending upon the positive voltage differential from 0 ms to 200 ms, the approximate amount of passivation can be determined.

Activated/Depassivated Batteries

Figure 3:
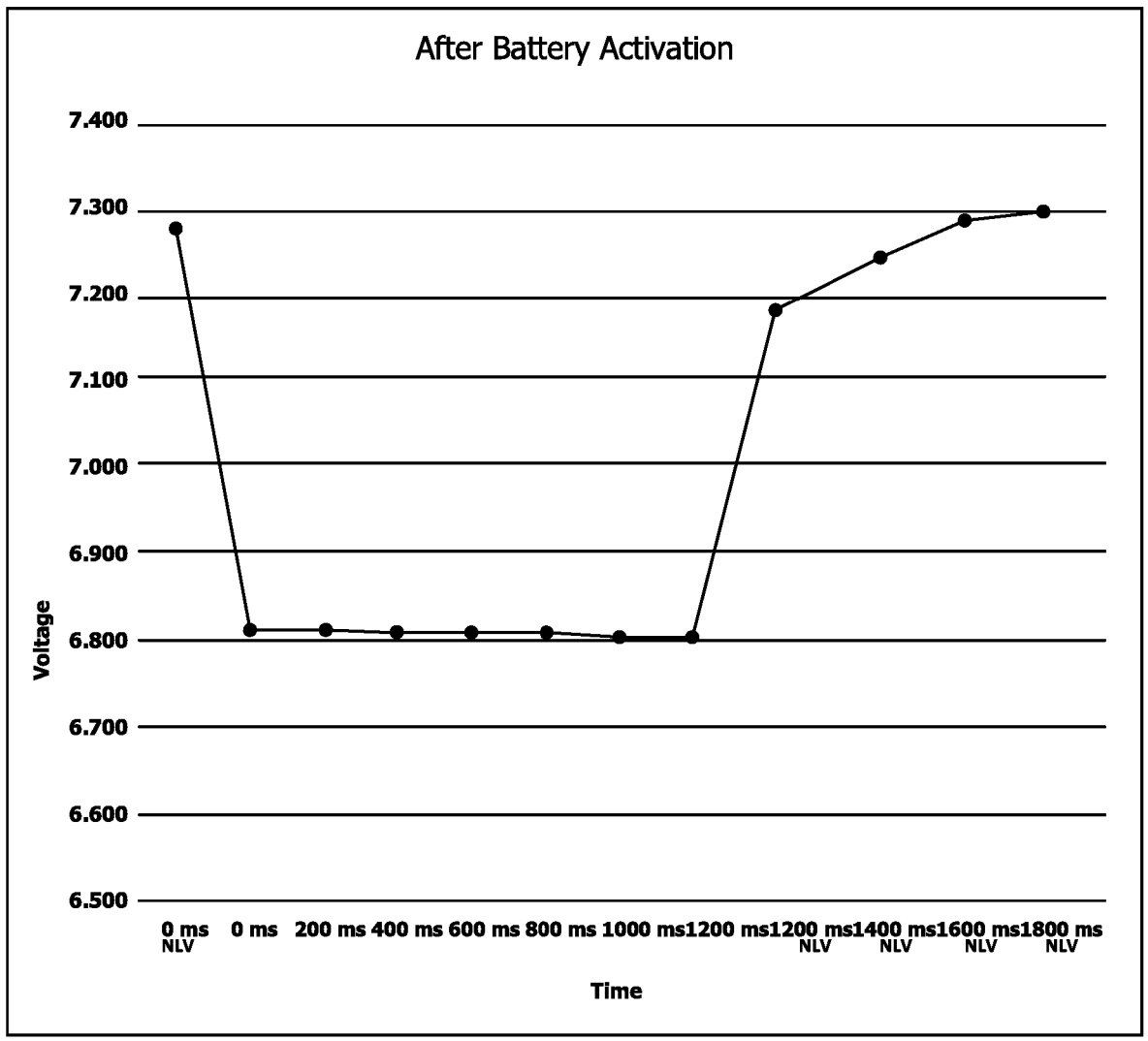
FIG. 3 is a graph illustrating the voltage response of an activated lithium battery during an evaluation.

FIG. 3 shows the voltage response curve of a fully activated battery that was depassivated for a predetermined period of time based on the amount of passivation with a predetermined load that is based on the constant current capacity and the amp-hour capacity of the battery. That is, the applied load to depassivate/activate a battery should draw approximately 20% of the battery's maximum continuous rated current, i.e., if the continuous rated current draw is 2 Amps, then the load should draw 400 mA. Smaller capacity batteries with a lower constant current will not need as long a depassivation period and may use a different resistive load to fully activate. In the example below, the two batteries in series were activated/depassivated with a resistive load that drew about 20% of the constant current capacity of the battery for a 30-minute period—about 1.4% of the Amp-Hour capacity of the battery. These numbers will vary based on battery capacity amp-hours and constant current draw capacity. Note how the voltage drops and then stays relatively flat. The sharp rise in FIGS. 1 and 2 is missing.

As detailed below, once the resistive load is applied (the same resistive load that was used to depassivate/activate the battery) the voltage drops immediately to ~6.8 volts for the entire evaluation period with only a negative 0.011 VDC (0.16%) drop from left to right. Activated batteries typically have a very small voltage difference across the entire evaluation (or test) period.

Depleted Batteries

Figure 4:
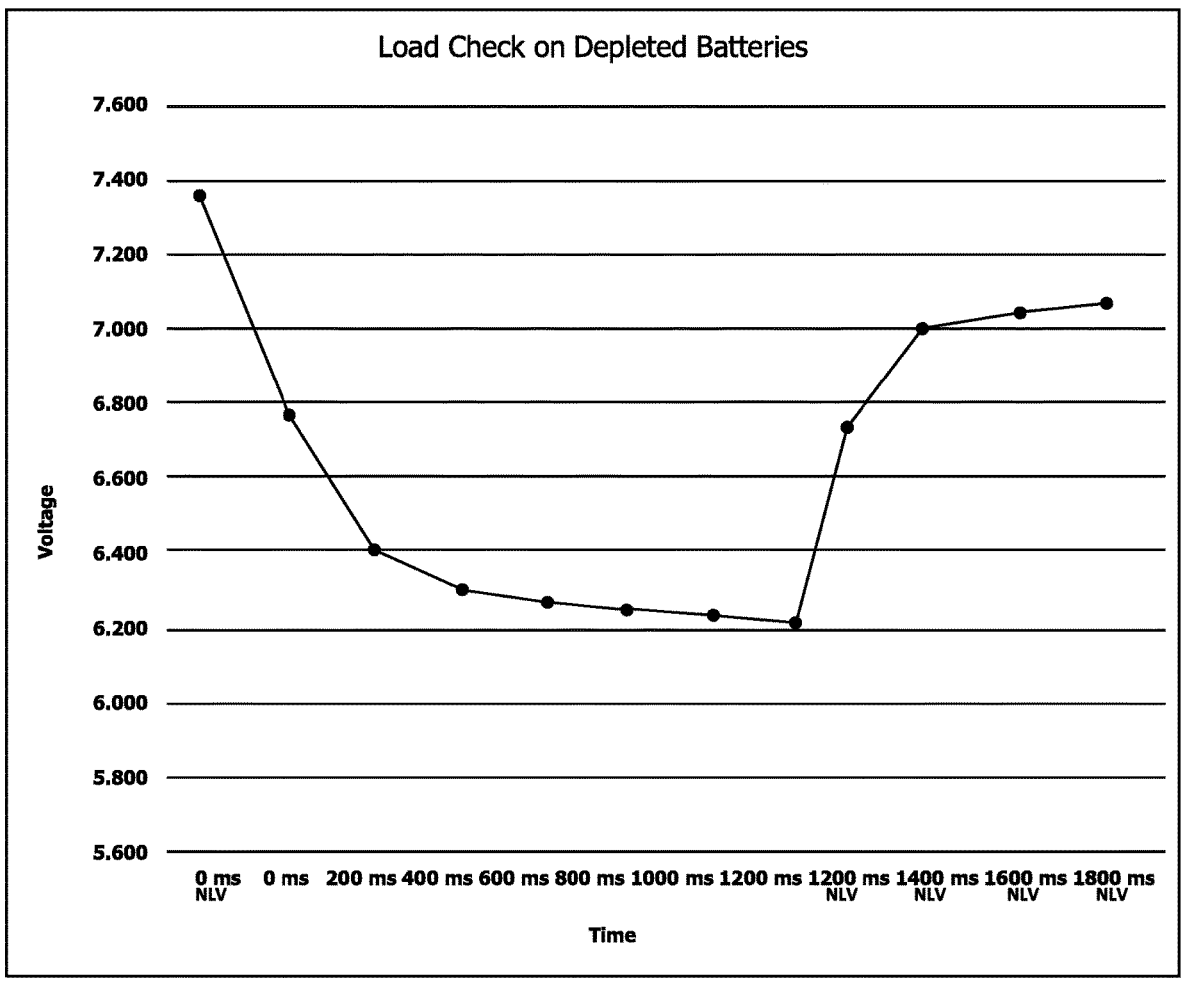
FIG. 4 is a graph illustrating the voltage response of a depleted lithium battery during an evaluation.

FIG. 4 shows the voltage response of a depleted battery during the evaluation period when the resistive load is applied. From 0 ms to 1200 ms (i.e. the evaluation period) the voltage drops from 6.758 VDC to 6.228 VDC, i.e. a −0.523 volt change (−7.7%). This is a battery that is at 18% of capacity and almost depleted. The voltage difference is relative to the number of batteries connected in series, so for example, for a single battery the measured voltages would be halved. Based on the voltage drop, the amount of depletion can be only estimated as lithium batteries can typically sustain voltage under load until they are near the depletion point. This example is of two batteries at approximately 18% of Amp-Hour capacity.

Partially Depleted and Partially Passivated Batteries

Figure 5:
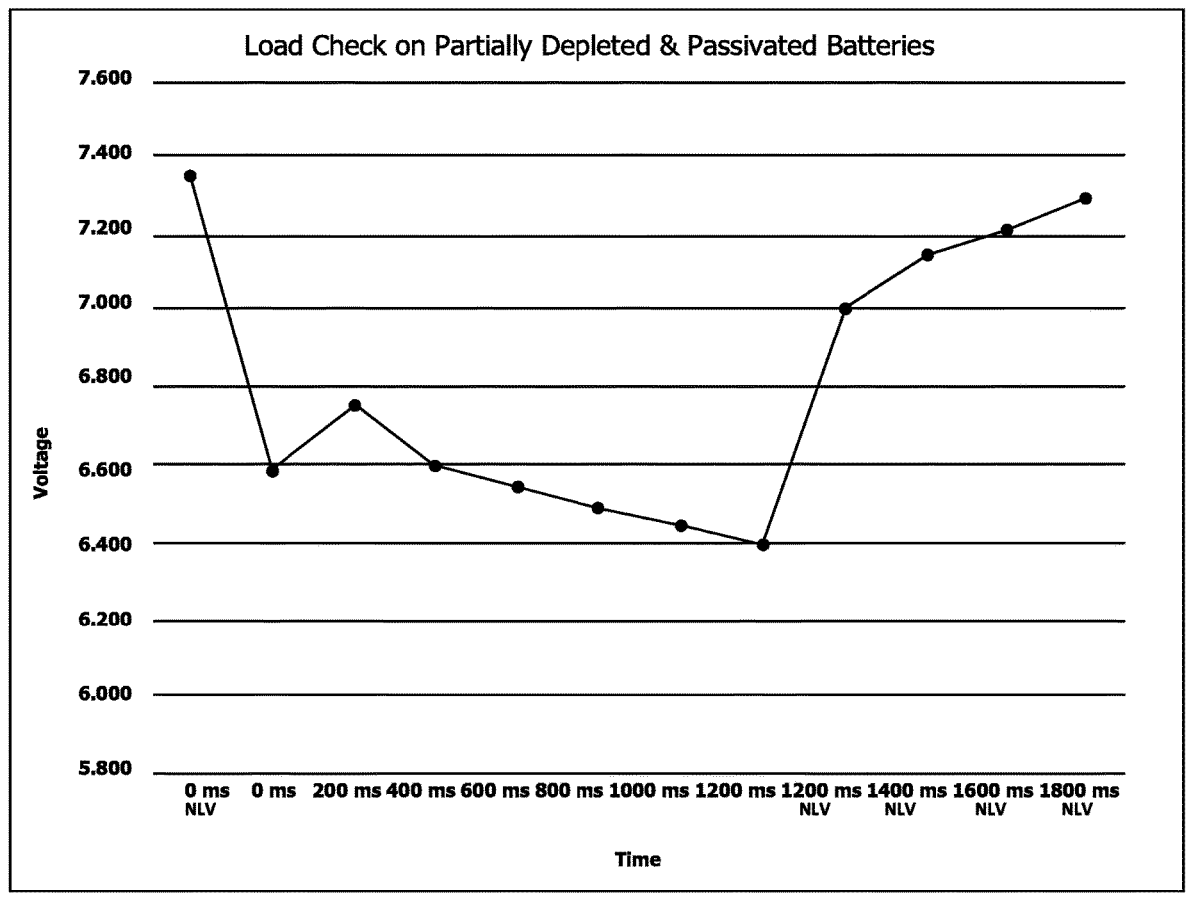
FIG. 5 is a graph illustrating the voltage response of a partially depleted/partially passivated lithium battery during an evaluation.

FIG. 5 shows the voltage response of a partially depleted/partially passivated battery during the evaluation period when the resistive load is applied. From 0 ms to 1200 ms (i.e. the evaluation period) the voltage drops at the 0 ms point then rises at the 200 ms point and then drops off during the rest of the evaluation period. The amount the voltage rises from 0 ms to 200 ms indicates the amount of passivation. The amount the voltage falls from 200 ms to 1200 ms indicates the amount of depletion. Based on the degrees of depletion and passivation, the correct amount of depassivation can be applied to the battery to reactivate it.

The present invention provides the ability to determine if batteries are fresh, i.e. not passivated, passivated or depleted so that a decision can be made whether or not a corresponding depassivation algorithm needs to be applied. This is extremely beneficial in active circuits that may be power-cycled after being deployed for several years in the field or powered up after long-term storage greater than 45-90 days. This also ensures that the batteries will be ready for use in products where battery usage is on demand.

Figure 6:
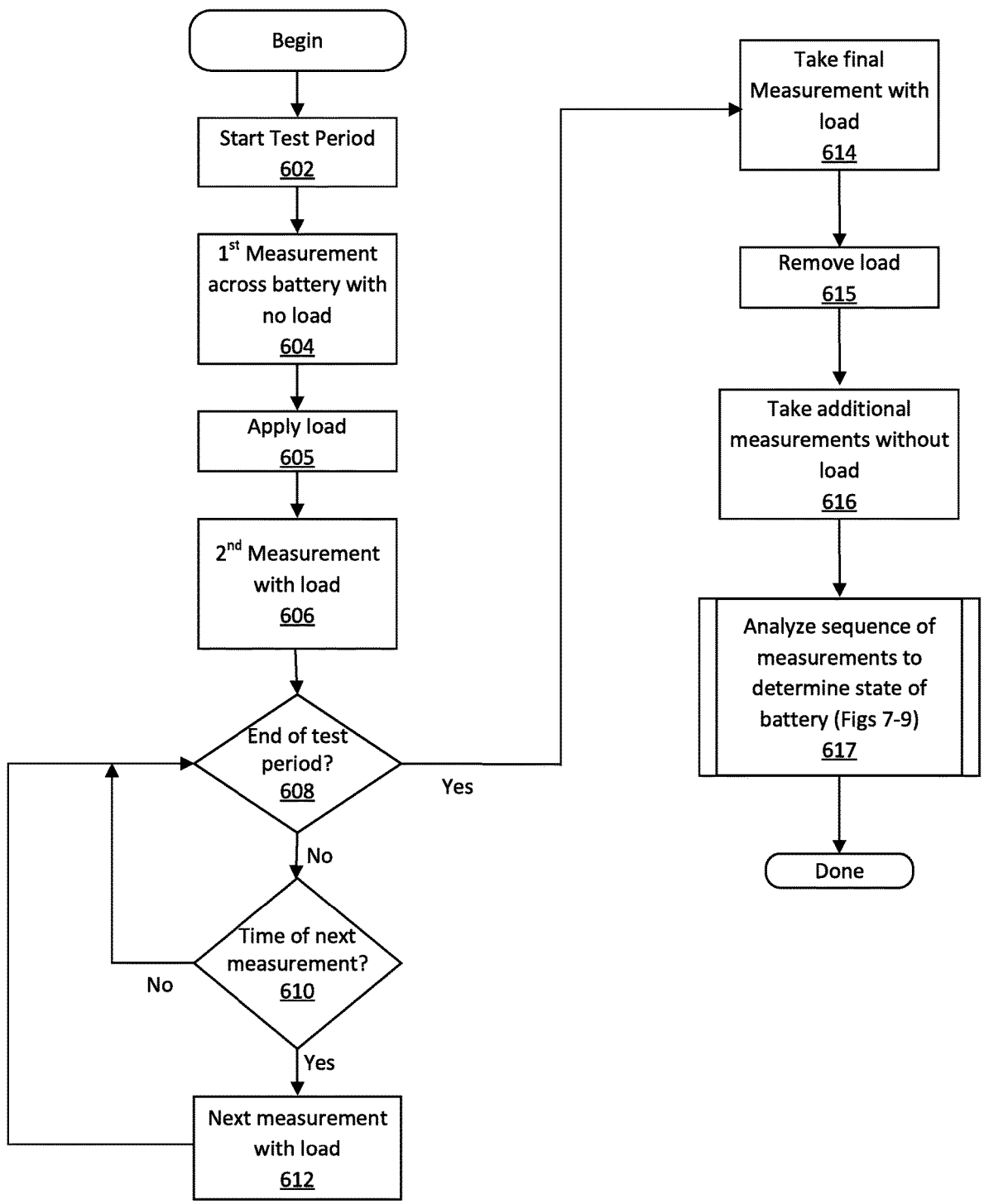
FIG. 6 is a flowchart illustrating the overall evaluation process.

FIG. 6 is a flowchart illustrating steps taken in an embodiment of the present invention. Step 602 begins the test period. The voltage of the battery being tested (the target battery) is measured without a load (Step 604). This coincides with the measurements shown in FIGS. 1-5 as "0 ms NLV".

In Step 605, the load is applied across the battery, and the battery voltage is again measured (Step 606)—corresponding to measurements shown in FIGS. 1-5 as "0 ms". Steps 608 and 610 form a wait loop to either wait until it is time for a next measurement, e.g., 200 ms, or until the end of the test period, e.g., 1200 ms. When it is time for another measurement, the voltage of the battery is again measured (Step 612).

When the test period is complete, a final measurement is taken with the load still applied (Step 614). This coincides with the measurements shown in FIGS. 1-5 as "1200 ms". At Step 615, the load is removed. Additional measurements of the battery's voltage may be made, corresponding to "1200 ms NLV", "1400 ms NLV" and so on (Step 616).

At Step 617, the sequence of voltage measurements is analyzed and a determination is made as to the state of the battery as described with respect to FIG. 7-9.

II. Lithium Battery Activation and Long-Term Maintenance

Passivation is the formation of an internal crystalline structure that preserves the chemistry of lithium batteries for long term storage. Ergo they can be stored for years with minimal reduction in overall Amp Hour capacity. Lithium batteries will immediately start to passivate if they are not being used. Passivation is typically fully achieved after 90 days of non-usage. While a battery is being used, there is typically a minimum current usage threshold required to prevent passivation. When a passivated battery is used, the voltage drops quickly under load as the passivation prevents the ability of the battery to supply current until the passivation is removed and the battery is activated.

In order to use a battery fully to its current limitations and draw-down capacity, for example, a battery might have a capacity of 13 amp-hours, the battery needs to be activated, i.e., depassivated. To activate a battery, a resistive load is applied in parallel with the battery to draw current to break down the crystalline structure. Most known methods use either a very high current for a short period of time or a much longer period of time at a much lower current draw. However, high current draws can change the battery characteristics including its impedance, and low current draws do not always fully activate the battery.

An embodiment of the invention uses a medium current draw based on a percentage of the maximum sustained current rating of the battery so as not to change the characteristic impedance of the battery and to fully activate the battery in a relative short period of time with minimal reduction in battery capacity. The amount of re-activation time is based on a detection algorithm that can determine the amount of passivation that needs to be removed.

Figure 10:
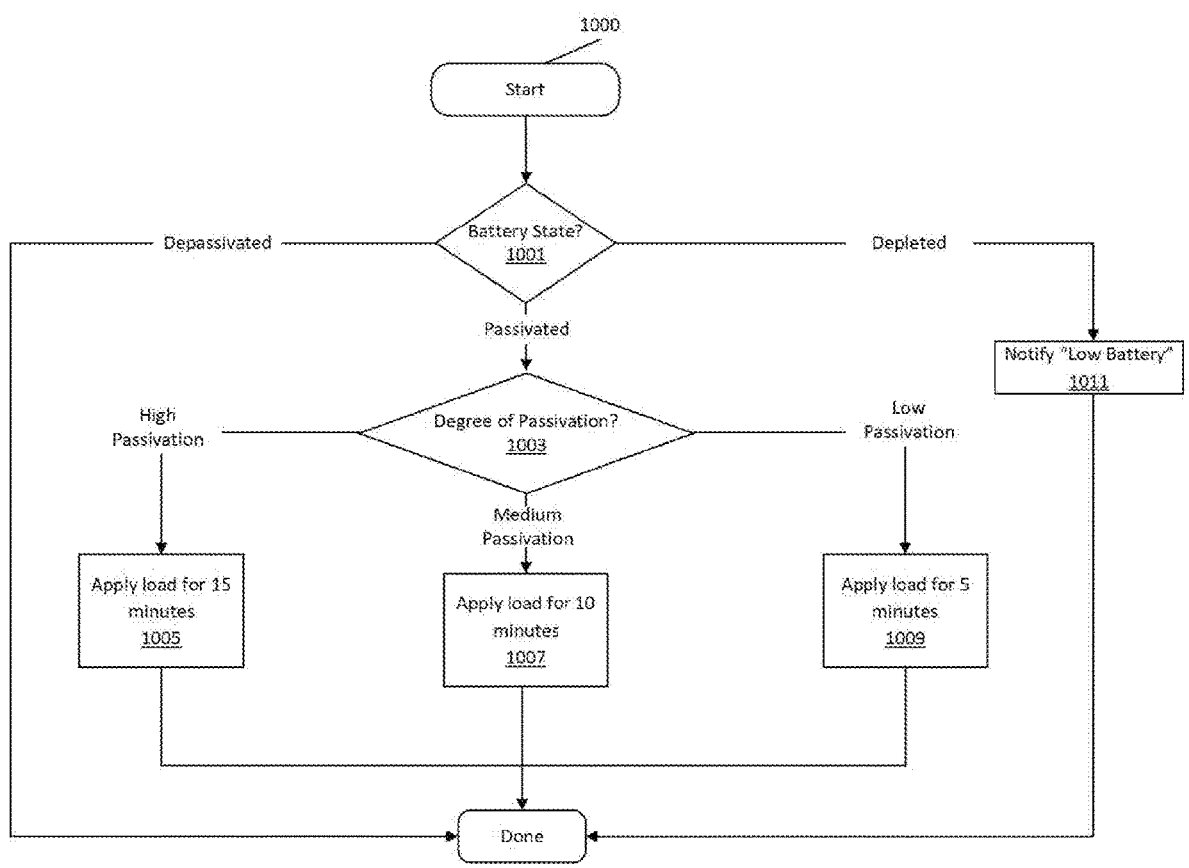
FIG. 10 is a flowchart illustrating a passivation algorithm of an embodiment of the present invention.

FIG. 10 is a flowchart illustrating a passivation algorithm of an embodiment of the present invention. Step 1001 examines the state and directs different responses depending on the state. If the battery is depassivated/active, no action is needed and the process terminates. If the battery is passivated, then the degree to which it is passivated is examined in step 1003. If the battery is highly passivated, then it is depassivated by applying a load for long term (15 minutes—step 1005). If the battery is medium passivated, then it is depassivated by applying a load for a medium term (10 minutes—step 1007). Finally, if the battery passivation is low, then it is depassivated by applying a load for a short term (5 minutes—step 1009). It should be understood that some embodiments more or less than three degrees of passivation may be determined, and different passivation durations (application of the load) may be used.

On the other hand, if the battery is depleted, a "low battery" warning may be transmitted in a notification (Step 1011) or otherwise indicated.

Assembled devices that are in long-term storage in a warehouse or at a customer's site may have partially or fully passivated batteries, and when powered up may indicate a false Low-Battery signal on the device due to the batteries not being fully active. False low battery signals can be prevented if the battery is evaluated, then activated as required/determined and then maintained. Also if the batteries are used in a standby circuit, such as an alarm circuit that is rarely used, the batteries may passivate if not maintained after activation. This process reactivates the batteries and then maintains the battery health preventing re-passivation once the battery has been activated.

In some embodiments, upon power-up, a 1,200 ms battery reading is done as soon as the device is up and running, and then repeated at 30 minutes and at 60 minutes. After the first 3 initial battery readings performed, the device may change to a Battery Maintenance phase and a Battery Maintenance Algorithm takes over that applies a 1,200 ms load once every 4 hours. Three low-battery readings in a row are interpreted as a low battery.

Once a battery has been activated, passivation must be prevented when, for example, the battery is installed in a device such as a fire alarm system sounder where the battery may be left either in standby mode with little to no current draw, or otherwise has a current usage that is below the minimum level to prevent passivation. Our algorithm uses a specific time-width current load pulse on a periodic basis that maintains the battery in an activated state and prevents passivation while maximizing battery capacity for the life of the battery.

For example, once a battery has been depassivated, the application of a timed load at approximately 20% of the maximum continuous draw of the battery at the correct periodic rate prevents passivation. A Battery Maintenance Anti-Passivation (AP) algorithm is applied to the batteries in the device. This algorithm may start, for example, on power-up or at the end of the De-Passivation (DP) procedure if a DP is required. The AP Algorithm applies a 20% max current draw load as described above for at least 1 second on a periodic basis determined to prevent passivation. In this example the resistive load is applied for 1,200 ms. Since complete Passivation is achieved in 90 days and passivation starts immediately, the 1,200 ms maintenance pulse needs to be applied regularly starting immediately. We have determined that pulses ranging from once every 2 hours to as much as once every 4 hours prevents passivation from occurring. At a rate of 1,200 ms every 4 hours, the cumulative reduction in battery capacity over the course of a year is only 0.00209%, a very minimal impact on battery life, but enough to take the average current usage above the threshold to prevent passivation.

III. Lithium Battery Passivation Detection, Activation and Maintenance Module

An accessory module may be bolted into an existing product (primary device) with lithium batteries. The module is connected to the terminals of the battery that may require depassivation and battery maintenance to prevent passivation. In an embodiment, the module uses the power from the target batteries to power the module and it operates independently of the primary control board and battery. After power-up this module will test the batteries to determine their passivation/depletion status and depassivate the batteries if needed in a single activation cycle and then maintains the active-state (depassivated) of the batteries using a specific time width current load pulse on a periodic basis that keeps the battery activated preventing passivation while maximizing battery capacity for the life of the battery. This module operates independently of the primary circuit which is using the target batteries.

Devices may be typified for a specific battery manufacturer and if a different battery manufacturer is used, the device may indicate a premature low-battery or even allow these alternate batteries to passivate. This module will allow the use of batteries from different manufacturers to be installed in the primary device with no changes required to its firmware or hardware, which would be impossible in a field deployed device. Once connected to the primary device, this module may take over the health and battery maintenance of the target batteries. The module may be included inside a battery pack, or connected to the target batteries, allowing devices to operate with different battery manufacturers. Optionally, the module may temporarily suspend the activation process during high power operations using the target batteries; for example, the module may monitor the target battery voltage profile during evaluation and depassivation procedures and halt these processes if the target batteries are being used in high power operations by the primary device. Fluctuations in the voltage of the target batteries indicate that the primary device is using the target batteries.

This is primarily intended for backwards compatibility for devices deployed in the field with a battery that is no longer being manufactured that needs replacement batteries, especially when the primary circuit is not optimized for the replacement batteries. The deployed devices are optimized for the obsolete battery and testing has shown that the replacement batteries will passivate in the deployed devices unless hardware and software changes are made to the product, i.e., all of the deployed devices would have to be replaced. This module bridges the gap allowing the deployed devices to continue to operate "as-is" using the new alarm batteries as needed and monitoring them for end-of-life, i.e. low battery with the current load check while the module will activate the replacement batteries and maintain their health, preventing passivation through the life of the battery.

By mounting the Passivation Detection, Activation and Maintenance (PDAM) module inside the device, no software change is required in the device itself. The PDAM module allows the device to use the load check on the board and the current Alarm low-battery set point of, for example, 7.11 VDC. The PDAM module runs independently of the device's main code. The PDAM module may be mounted inside the device with the same screws that hold the main PCB in place below the speaker or sounder. There are 3 wires with 0.093" push-on connectors that slide onto the terminals on the battery holders. The terminals may have to be bent to a 90 degree angle. The wire lengths and positions may be such as to prevent the wires from being plugged into the wrong terminals and have battery protection reversal circuitry as well. The PCB is keyed so that it can only be mounted one-way and is incompatible with other models.

Figure 11:
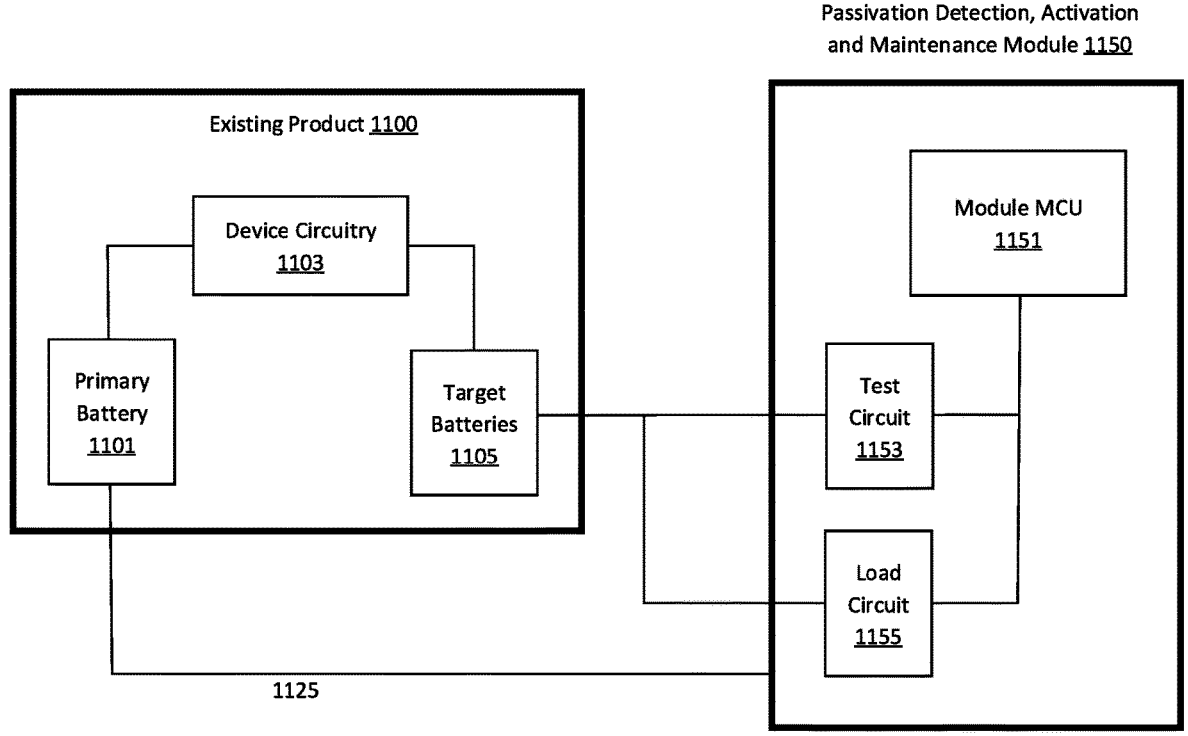
FIG. 11 is a block diagram illustrating the relationship between an existing product and a Passivation Detection, Activation and Maintenance (PDAM) module of an embodiment of the present invention.

FIG. 11 is a block diagram illustrating the relationship between an existing product, such as a fire alarm system sounder 1100, and a Passivation Detection, Activation and Maintenance (PDAM) Module 1150. The existing product or device includes circuitry 1103 for performing the intended function of the device, such as sending and receiving wireless messages and controlling a transponder 1107, e.g., a strobe or a speaker. A secondary battery (the target battery 1105) provides the power needed to activate the transponder 1107. This battery 1105 may not be called upon to power the transponder for a long time, and hence left to its own, may passivate and not be able to provide sufficient power when there is an event. Thus, there is a need to maintain the battery 1105 in an active (depassivated) state.

The PDAM module 1150 may be installed into the device 1100. It may derive power from the device's primary battery 1101 via conductor 1125, or alternatively it may derive power from the target battery 1105 via conductors 1127, the same wires through which the PDAM module 1150 monitors and depassivates the target battery 1105.

In the case where the PDAM module 1150 is powered from the target battery 1105, it is still beneficial for the module 1150 to monitor the primary battery 1101 before taking any action because without sufficient power from the primary battery 1101, the device 1100 cannot operate. When the primary battery is installed/replaced and the device 1100 has to power up and join or rejoin a network, the PDAM module 1150 will monitor and then depassivate the target battery 1105 if necessary.

Figure 12:
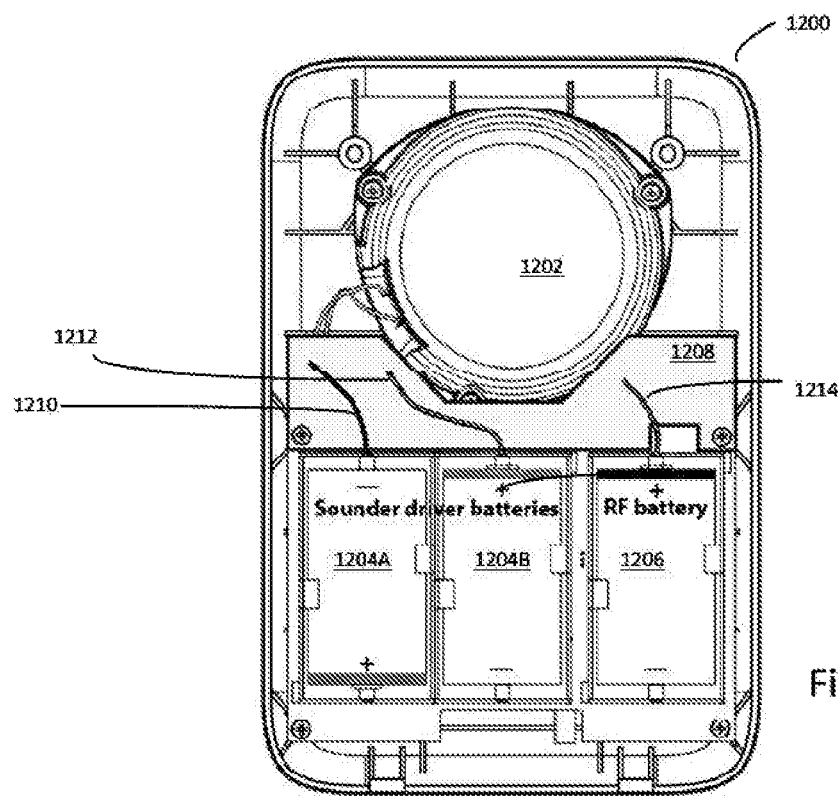
FIG. 12 is a drawing illustrating the placement and connectivity of the PDAM module used to upgrade an existing sounder.

FIG. 12 is a mechanical drawing illustrating the placement of the PDAM Module 1208 used to upgrade an existing sounder 1200. The sounder includes a speaker 1202 and a first battery 1206 for driving RF circuitry and/or other control circuitry (not shown). In this example two batteries 1204A, 1204B are connected in series to deliver the power needed to drive the speaker. These two batteries 1204A, 1204B collectively are considered to be the "target battery".

As shown, a PDAM module 1208 has been installed onto the sounder. Ground wire 1210 runs from the module to the negative terminal of one of the batteries, here battery 1204A. The positive terminals of both battery 1204B (serving as the positive terminal of the target battery) and battery 1206 are connected to the module 1208 via wires 1212 and 1214 respectively. These wires 1210, 1212, 1214 may have clips at the ends to allow them to slip directly onto the battery holder terminals.

The PDAM module 1208 is able to perform each of the passivation detection, depassivation and maintenance algorithms described previously without interfering with the operation of the device 1200.

What is claimed is:

1. A method for determining lithium battery passivation by a detection circuit coupled with the lithium battery, comprising:

applying a load across the lithium battery to begin a test interval;

obtaining periodic voltage measurements of the lithium battery during the test interval;

determining a state of the lithium battery is a passivation state in response to a voltage change between two of the periodic voltage measurements being greater than or equal to a threshold;

determining the state of the lithium battery is a depletion state in response to the voltage change between the two of the periodic voltage measurements being less than the threshold;

selecting and performing a depassivation process of the lithium battery from a plurality of depassivation processes in response to determining the state to be the passivation state, wherein the depassivation process is selected based on a degree of the passivation state; and sending a notification of the lithium battery being depleted in response to determining the state to be the depletion state.

2. The method of claim 1, wherein the degree of the passivation state of the lithium battery is one of: depassivated, partially passivated, or fully passivated; and wherein the depletion state of the lithium battery is one of: full capacity, partially depleted, or fully depleted.

3. The method of claim 1, further comprising:

determining the degree of the passivation state based on a second voltage change between a first measurement of the periodic voltage measurements and a final measurement of the periodic voltage measurements being within one of a plurality of passivation ranges.

4. The method of claim 3, wherein the plurality of passivation ranges includes a first passivation threshold and a second passivation threshold, wherein the method further comprises:

determining the degree of the passivation state is a first degree of passivation in response to the second voltage change being greater than or equal to the first passivation threshold;

determining the degree of the passivation state is a second degree of passivation in response to the second voltage change being between the first passivation threshold and the second passivation threshold; and determining the degree of the passivation state is a first degree of passivation in response to the second voltage change being less than or equal to the second passivation threshold.

5. A method for determining lithium battery passivation by a detection circuit coupled with the lithium battery, comprising:

applying a load in series with the lithium battery;

obtaining a sequence of voltage measurements, periodically during a test interval, of output voltage of the lithium battery across the load;

matching the sequence of voltage measurements against a set of profiles;

determining a state of the lithium battery is a passivation state in response to a profile of the set of profiles most closely matching the sequence of voltage measurements;

determining the state of the lithium battery is a depletion state in response to a second profile of the set of profiles most closely matching the sequence of voltage measurements;

selecting and performing a depassivation process of the lithium battery from a plurality of depassivation processes in response to determining the state to be the passivation state, wherein the depassivation process is selected based on a degree of the passivation state; and sending a notification of the lithium battery being depleted in response to determining the state to be the depletion state.

6. The method of claim 5, wherein the degree of the passivation state of the lithium battery is one of: depassivated, partially passivated, or fully passivated; and wherein the depletion state of the lithium battery is one of: full capacity, partially depleted, or fully depleted.

7. A first device in wireless communication with a second device, the first device comprising:

an electronic circuit;

a lithium battery configured to provide power to the electronic circuit;

a battery test circuit configured to:

obtain periodic voltage measurements taken during a test interval with a load across the lithium battery;

determine a state of the lithium battery is a passivation state in response to a voltage change between two of the periodic voltage measurements being greater than or equal to a threshold; and determine the state of the lithium battery is a depletion state in response to the voltage change between the two of the periodic voltage measurements being less than the threshold; and a depassivation circuit configured to:

select and perform a depassivation process of the lithium battery from a plurality of depassivation processes in response to determining the state to be the passivation state, wherein the depassivation process is selected based on a degree of the passivation state; and send a notification of the lithium battery being depleted in response to determining the state to be the depletion state.

8. The first device of claim 7, further comprising a microcontroller for operating the battery test circuit and the depassivation circuit.

9. The first device of claim 7, wherein the first device is a notification appliance that wirelessly communicates with a fire panel, and further is configured to receive power from a main power source, the notification appliance further comprising:

at least one notification annunciator, the notification appliance configured such that the lithium battery supplies power to the at least one notification annunciator when the power from the main power source fails.

10. The first device of claim 9, wherein at least one notification annunciator is a speaker.

11. The first device of claim 7, wherein the degree of the passivation state of the lithium battery is one of: depassivated, partially passivated, or fully passivated; and wherein the depletion state of the lithium battery is one of: full capacity, partially depleted, or fully depleted.

* * * * *